United States Patent [19]

Lindenborg

[11] 4,179,666
[45] Dec. 18, 1979

[54] METHOD AND CIRCUIT FOR CONTROLLING THE OUTPUT SIGNAL OF A VARIABLE CONTROL CIRCUIT

[75] Inventor: Jon M. Lindenborg, Indianapolis, Ind.

[73] Assignee: Western Electric Company, Inc., New York, N.Y.

[21] Appl. No.: 898,563

[22] Filed: Apr. 21, 1978

[51] Int. Cl.² .............................................. H03G 3/20
[52] U.S. Cl. ...................................... 330/138; 320/1; 323/93; 330/280
[58] Field of Search ........................... 179/175; 320/1; 330/138, 280; 323/93

[56] References Cited

U.S. PATENT DOCUMENTS

| | | | |
|---|---|---|---|
| 3,259,849 | 7/1966 | Willett et al. | 330/280 |
| 3,440,543 | 4/1969 | Polzl | 330/280 X |
| 4,075,623 | 2/1978 | Futagawa et al. | 320/1 X |

Primary Examiner—Lawrence J. Dahl
Attorney, Agent, or Firm—J. J. Jordan

[57] ABSTRACT

The output voltage of a variable control circuit, such as a variable gain amplifier, (20, FIG. 1), is controlled by a circuit interconnected in the feedback circuit of the amplifier. The circuit determines whether the output voltage falls within a predetermined range by comparing (201, FIG. 2) the output voltage with a reference voltage. If the output voltage falls within the predetermined range, a capacitor (207) is charged. Interconnected with a control input lead (72) of the variable gain amplifier (20), the charge on the capacitor controls the output voltage produced by the variable gain amplifier.

13 Claims, 2 Drawing Figures

METHOD AND CIRCUIT FOR CONTROLLING THE OUTPUT SIGNAL OF A VARIABLE CONTROL CIRCUIT

FIELD OF THE INVENTION

This invention relates to a method and circuit for controlling the output signal of a variable control circuit.

DESCRIPTION OF THE PRIOR ART

During the manufacture of telephone sets, and other electrical products, which are directly used by the general public the telephone sets undergo rigorous safety testing to detect potential electrical hazards and electrical discontinuities. Typically performed as one of the final steps on a manufacturing line, the safety testing involves connecting the metal frame of the telephone set to ground and then touching various current carrying components in the set with a test probe having a predetermined test voltage appearing at the probe. Unwanted shorts to exposed metal will be detected and cause a visual and/or audible indication on the test set. This type of testing, commonly called breakdown testing, insures reasonable public protection against current leakage and arc-over to exposed metal during conditions of lightning transients, line transients, and power crosses, while also providing protection to the telephone network from harm resulting from foreign power sources in contact with exposed metal.

The test voltage appearing at the probe must be at least a certain minimum amplitude in order to insure a valid safety test. If the test voltage exceeds the minimum amplitude, the safety test is valid since the set being tested is subjected to more stringent voltage requirements than necessary. When the test voltage appearing at the test probe is below the minimum amplitude, the test is not a valid safety test.

As described above, breakdown testing is normally one of the final tests performed on a manufacturing line by an operator using the test probe having a high voltage. In order to insure operator safety and proper testing, the operator holds the probe in contact with the circuit under test before activating circuitry in the test set for supplying high voltage to the probe. On most telephone sets, there are a plurality of test points to be tested to complete an entire safety test of the set. Also, the test set circuit typically has a quick shutdown circuit for automatically cutting off power to the test probe when an electrical short or arc occurs. Additionally, the test set operator may require different particular voltages, e.g., 500, 1000, 1500 volts, to perform breakdown tests on a variety of telephone sets appearing at the test position. Furthermore, as different points in the telephone sets are tested, different loads are placed at the test probe. Thus the test routine involves periods when no voltage appears at the test probe interspersed with shorter periods when it is required that a particular voltage appear at the probe, regardless of the load being tested. Since the test procedure typically is one of the final procedures on a manufacturing line, the faster the required voltage appears at the test probe, the faster the operator can perform the required test and keep products flowing on the manufacturing line.

In order to provide a particular high voltage at a test probe, a common test set arrangement comprises a 60 HZ filtered signal (from commercial power) connected to a voltage controlled variable gain amplifier which in turn feeds power to an amplifier-transformer combination whose output is connected to the test probe. The output to the test probe is also fed back through a feedback circuit to an input of the voltage controlled amplifier for control purposes. Typically, the feedback circuit contains a low pass filter. However, these type of feedback circuits, although eventually regulating the output voltage to approach the desired voltage, have not been able to quickly provide the desired output since they operate in a hunting routine. That is, as the above arrangement starts up it produces a signal at the test probe which initially overshoots the required voltage amplitude, the feedback circuit filter will attempt to lower the output signal by adjusting the signal appearing on the control input to the variable gain amplifier. This results in decreasing the output voltage at the probe to an amplitude lower than the required output. The feedback filter sensing that the output voltage is lower than desired will now operate to adjust the signal appearing on the control lead to the variable gain amplifier to control the amplifier to produce a higher output voltage. The filter will keep adjusting the feedback signal, higher and lower, until the voltage output is the required particular output. This continued adjusting of the output voltage, upward and downward, until the desired level is achieved is commonly called hunting.

As just described, since the hunting technique results in the output voltage being periodically lower than the required level, this type of voltage control circuit can result in invalid tests being performed during that period. Moreover, the above described voltage control circuit does not quickly provide an output voltage at the required level.

SUMMARY OF THE INVENTION

With the foregoing and other objects in view, a method for controlling the output voltage of a variable control circuit is disclosed.

The method comprises the steps of determining whether the output voltage is within a predetermined range and charging a capacitor when the output voltage is within that predetermined range. The capacitor is connected to the input of the variable control circuit.

A circuit to implement the instant method for controlling the output of a variable control circuit comprises a capacitor connected to an input of the variable control circuit and means responsive to the output voltage for selectively charging the capacitor when the output voltage falls within a predetermined limit.

Thus the present invention permits a variable control circuit to quickly generate an output voltage having at least a desired minimum amplitude.

Additionally, the charged capacitor permits the variable control circuit to hold the desired output voltage amplitude for a period of time.

Furthermore, the present method and circuit advantageously permit a variable control circuit to generate a high voltage output having a desired amplitude without employing circuitry which causes a "hunting" effect.

BRIEF DESCRIPTION OF THE DRAWINGS

The invention and its mode of operation will be more clearly understood from the following detailed description when read with the appended drawings in which.

DETAILED DESCRIPTION

The instant invention is related to a method and circuit for controlling the output of a variable control circuit and is herein described in relation to controlling the output voltage of a variable gain amplifier. However, it should be understood that such description is exemplary only and is for the purposes of exposition and not for purposes of limitation. It will be readily appreciated that the inventive concept as described is equally applicable for controlling the output voltages of other variable control circuits such as electric motors in general and in particular, in electric cars and conveyor systems.

Figure 1:
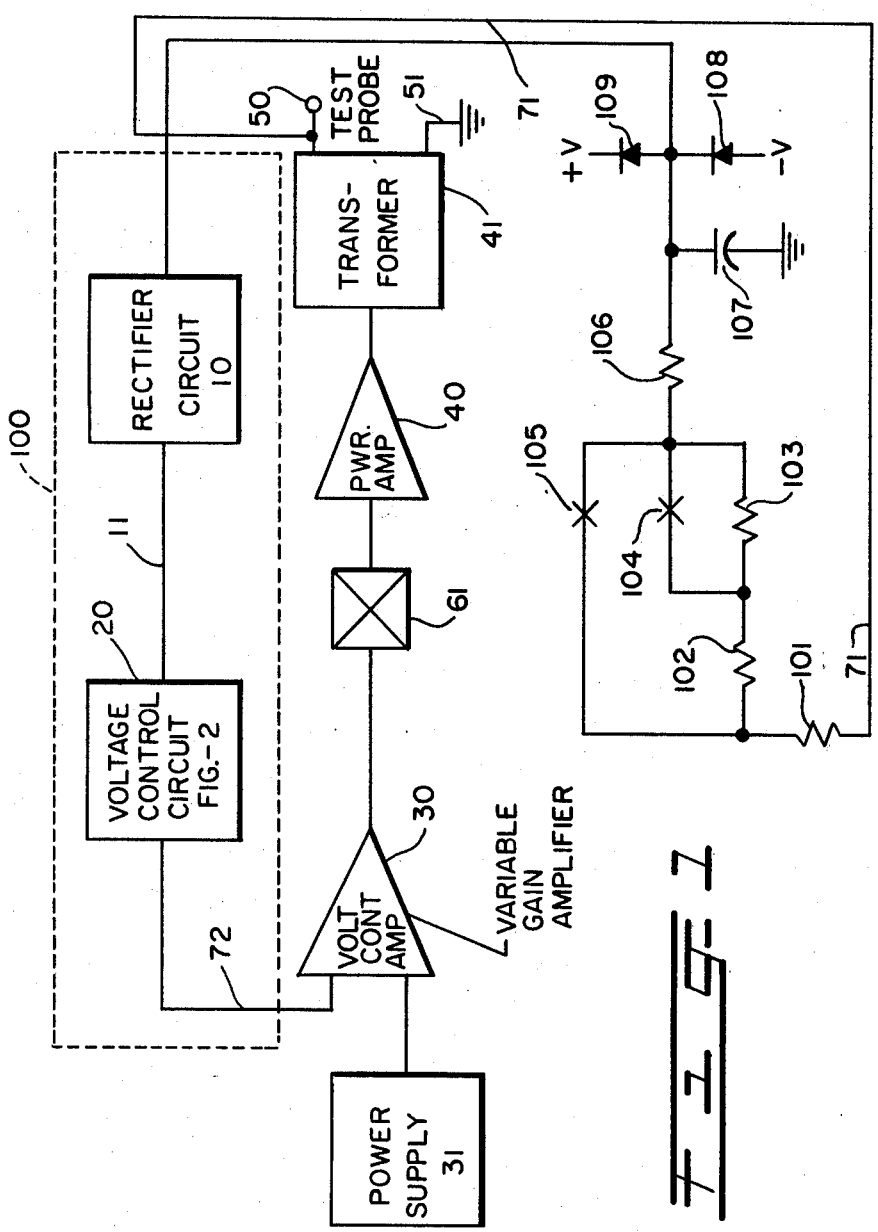
FIG. 1 is a block diagram illustrating the major functional components of a high voltage power supply circuit including a voltage control circuit for controlling the output voltage of a variable gain amplifier which circuit embodies the principles of the present invention.

Referring to FIG. 1, there is shown a functional block diagram and circuitry of a specific illustrative high voltage power supply circuit of a test set using a voltage control circuit 20 for controlling the output voltage of a variable gain amplifier 30. The arrangement comprises a power supply 31, typically generating a 100 MV AC output, which power supply interconnects with the input side of a variable gain amplifier 30. The variable gain amplifier 30 is a conventional voltage controlled variable gain amplifier which amplifies the signal received from the power supply 31. The amount of amplification introduced by the amplifier is directly controlled by the amplitude of a DC control voltage signal received from the voltage control circuit 20 on a lead 72.

The output of the variable gain amplifier 30 is impressed through a closed switch 61 and a power amplifier 40 to a transformer 41 whose output is applied to a test probe 50 as well as to a feedback circuit 100.

The switch 61 is a normally open switch whose operation will be described in detail below.

The power amplifier 40 is a commercially available power operational amplifier, typically a Fairchild type 791 power amplifier. The transformer 41 is a common step-up transformer introduced to produce a 60 HZ output signal at a particular voltage at the test probe 50.

The test probe 50 is used by the test set operator to check current carrying conductors in a telephone set under test. The ground lead 51 is attached to the metal frame of the telephone set, and the test probe 50 is placed in electrical contact at a particular test point in the telephone set. Voltage is applied to the test probe 50, and if there is an electrical short in the telephone set, current will flow through the probe 50 and the detected short to the ground 51, thereby exciting an alarm system, not shown, in the test set.

The feedback circuit 100, comprising a rectifier circuit 10 and the voltage control circuit 20, is interconnected with the variable gain amplifier 30 by a lead 72 and with the test probe 50 by a safety network comprising diodes 108 and 109, a capacitor 107, resistors 101, 102, 103 and 106, and switches 104 and 105, and by a lead 71. The feedback circuit 100, depending upon the output voltage monitored at the test probe 50, introduces appropriate control signals on the input lead 72 to control the output of the variable gain amplifier 30.

The resistors 101, 102 and 103 are current limiting sense resistors for reducing the amount of current introduced into the feedback circuit 100. The switches 104 and 105 are activated by the test set operator to insert the proper amount of resistance into the circuit depending on which high output voltage signal, e.g., 500 V, 1000 V, 1500 V will appear at the test probe 50 during this test cycle. The resistor 106, capacitor 107 and clamp diodes 108 and 109 act as a safety network to prevent any unwanted high frequency transient signals from appearing at the input to the rectifier circuit 10.

The signal appearing at the input to the rectifier circuit 10 is typically a 60 HZ sine wave. The rectifier circuit 10 is a conventional full wave rectifier circuit employing operational amplifiers, arranged in a cascaded network, and associated circuitry in a feedback configuration to eliminate diode drop. The rectifier circuit 10, also known as a "Precision full wave rectifier" is fully described in "Operational Amplifiers, Design and Application" by J. G. Graeme, G. E. Tobey and L. P. Hulsman; McGraw Hill, 1971, New York, N.Y. at page 249.

The rectifier circuit 10 operates to convert the sine wave signal appearing at its input to a full wave rectified signal appearing at the input connector 11 to the voltage control circuit 20.

Figure 2:
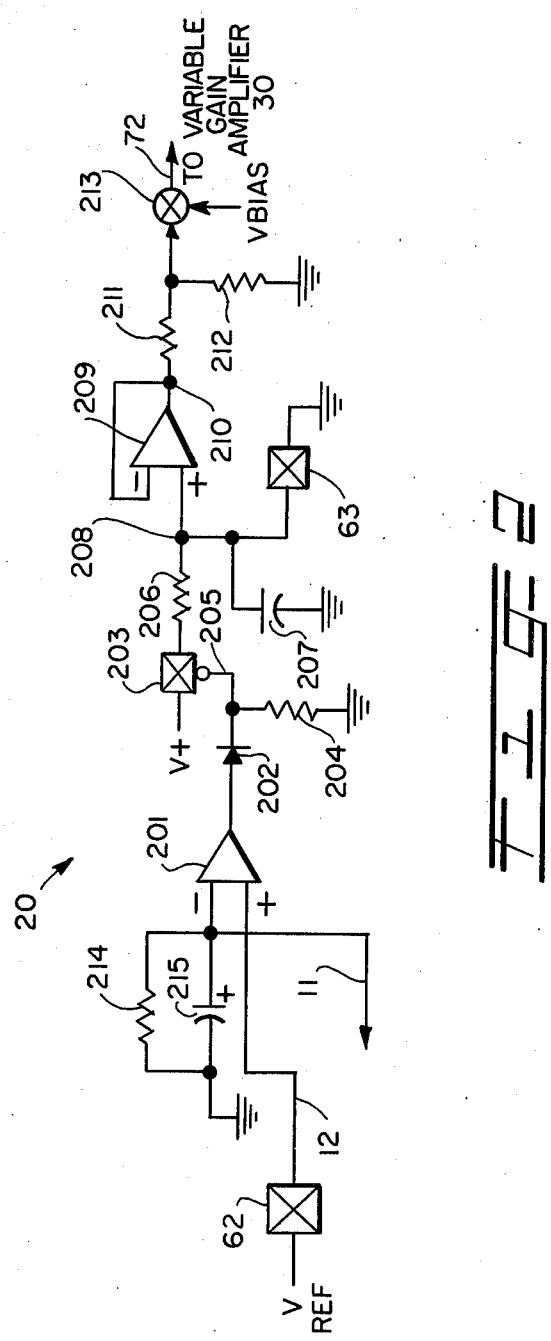
FIG. 2 is a schematic drawing which discloses in detail the circuitry associated with the voltage control circuit shown in block 10 in FIG. 1.

Referring now to FIG. 2, the capacitor 215 and resistor 214 act as a filter to smooth the full wave signal generated by the rectifier circuit 10 by producing a non-rippled DC signal input at the lead 11 to a comparator circuit 201. The amplitude of the non-rippled DC signal appearing at the lead 11 is proportional to the amplitude of the high voltage output currently appearing at the test probe 50.

Appearing at the input 12 to the comparator circuit 201 is a DC reference voltage, V ref. The amplitude of the reference voltage, V ref, is equal to the amplitude of the DC output signal generated by the rectifier 10 and the capacitor 215 and the resistor 214 when the high voltage output appearing at the test probe 50 reaches the required level for permitting a valid test to be performed.

A switch 62, a normally open contact, is arranged to close the path interconnecting comparator circuit 201 and V ref. The operation of switch 62 will be described in detail below.

The comparator circuit 201 is a conventional voltage comparator, typically a 741 type commercially available operational amplifier, which becomes energized when the amplitude of the DC signal appearing on the connector 11 is less than the DC amplitude of the V ref signal appearing on the connector 12. Thus, when the high voltage output appearing at the test probe 50 is less than the required test voltage, the rectified DC signal appearing at the connector 11 will be less than V ref appearing at the connector 12 and comparator circuit 201 is energized and applies a first type of signal, a positive voltage, over lead 205. When the rectified DC signal appearing at the connector 11 is equal to or greater than the V ref appearing at the connector 12, the comparator circuit 201 is not energized and a second type of signal, no voltage, is applied over lead 205.

Since the rectified DC signal appearing on connector 11 is a function of the high voltage output appearing at test probe 50 and since the required test voltage is a function of the reference voltage V ref appearing on connector 12, the comparator circuit 201 is energized only when the high voltage output signal appearing at test probe 50 is less than the required test voltage. Thus when the high voltage output signal appearing at test probe 50 falls within a predetermined range of voltage output signals, the predetermined range of signals comprising voltage output signals which are less than the required test voltage signal, the comparator circuit 201 is energized.

A diode 202 and a resistor 204 prevent any negative signals from being introduced through the comparator circuit 201 when that circuit is de-energized.

When the comparator circuit 201 becomes energized, a positive signal is applied over the lead 205 to switch 203, a normally open switch, which operates to close when the positive signal appears on the lead. The closed switch 203 connects a positive energy supply V+ through the resistor 206 to energize the capacitor 207. By selecting an appropriate value of resistance for the resistor 206 and of capacitance for the capacitor 207, the rate at which a charge is built up, or stored on the capacitor 207 can be varied. In the present circuit, the resistor 206 (180 Kohms) and the capacitor 207 (22 microfarad) are of such values to permit a rapid, uniform, build up of a charge to a predetermined value on the capacitor 207.

The buffer amplifier 209 is a typical operational amplifier, well known in the art. The amplifier is a high input impedance, voltage follower, that is, the voltage seen at the input, point 208, is exactly the same as the voltage seen at the output, point 210, of the amplifier 209. The buffer amplifier 209 eliminates load effects of circuitry connected to the output of amplifier 209 from causing an unwanted discharge of capacitor 207.

Typically a negative bias is to be added to the signal appearing at the point 210, the output of operating amplifier 209.

Resistors 211 and 212 aid in helping to add the appropriate bias which is shown symbolically added at the point 213. The bias to be added is dependent upon the type of transistor used as part of the control input circuit of variable gain amplifier 30. Typically, a 0.5 to 2 volt DC negative bias is required to be added for a proper control signal.

The signal appearing at the output of the bias added circuit 213 which is the sum of the voltage appearing at point 210 and the added negative bias, is applied to the control input lead 72 of the variable gain amplifier 30 for controlling the output voltage of the amplifier.

Also, regardless of the load placed between the test probe 50 and the ground 51, the voltage control circuit 20 will operate to adjust the variable gain amplifier 30 to produce the proper voltage output level. When the load is increased, the comparator circuit 201 will remain no longer thereby permitting capacitor 207 to be charged for a longer time such that the control signal seen at the input lead 72 of the variable gain amplifier 30 is increased sufficiently.

In order to more fully understand the operation of the entire circuit, a typical test cycle will be described. The test set operator, requiring a high output voltage at test probe 50, (FIG. 1), activates a switch 61, FIG. 1 and the switches 62 and 63, FIG. 2. The test set operator can activate these switches manually or automatically by means of a control circuit or timer circuit, which is normally included in most test sets. The switch 61, a normally open switch, operates to close thereby connecting the output of the variable gain amplifier 30 to the power amplifier 40 resulting in a signal appearing at the test probe 50 through the transformer 41. Initially this signal is at a low voltage level and a rapid buildup to at least a desired level is required for the operator to perform the safety test. When the desired output voltage level is reached, the test set typically signals the operator that a valid test can be performed. A common signal, not shown, is that a particular lamp on the test set is turned on indicating to the operator that the output voltage has reached a desired level.

The switch 62 (FIG. 2), a normally open switch, operates to close thereby connecting reference voltage V ref to the comparator circuit 201 via a lead 12. While the switch 62 is open, the comparator circuit 201 is off since it becomes energized only when the amplitude of the voltage of the signal appearing on lead 11 is less than that appearing on lead 12. The switch 63, a normally closed switch, operates to open thereby disconnecting the capacitor 207 from ground. The significance of the operation of the switch 63 will be explained in detail below.

As described above, since the test set has just been activated by the operator, the output voltage appearing at the test probe 50 is initially very low. Thus the voltage signal appearing at the input lead 71 to the feedback loop 100 is low and the output of the rectifier circuit 10 on lead 11 is substantially lower than the predetermined reference voltage, V ref. The comparator circuit 201 is energized and a signal is transmitted on lead 205 to close normally open switch 203.

Energy source V+ is now connected to the capacitor 207, which begins charging at a rapid uniform rate.

Since the buffer amplifier 209 is a high impedance voltage follower, the voltage signal seen at the point 208 follows, or is the same as, the charge being stored by the capacitor 207, while the voltage signal seen at the point 210 is the same as that seen at the point 208.

As the charge being stored by the capacitor 207 increases, the amplitude of the voltage signal appearing at the points 208 and 210 increases thereby increasing the amplitude of the voltage signal appearing on control input lead 72 to variable gain amplifier 30, FIG. 1. The variable gain amplifier 30 is thus controlled to produce higher output signals to the power amplifier 40, FIG. 1.

As the high voltage output seen at the probe 50 increases, the rectified signal seen at the input lead 11 to comparator 201 increases until the desired high output voltage is reached. When this occurs, the rectified signal seen at the input lead 11 is no longer less than the reference voltage V ref appearing at the lead 12 thus forcing the comparator circuit 201 to turn off and opening the switch 203. The capacitor 207 is now no longer connected to the energy source V+.

At this point, the capacitor 207 discharges at a very slow rate thereby keeping the voltage seen at the points 208 and 210 constant. Since the voltage signal seen on the input lead 72 to the variable gain amplifier 30 is constant, the output of the variable gain amplifier 30 is held constant insuring that the required high voltage signal presently appearing at the test probe 50 is maintained at the desired level. The charge on the capacitor 207 normally dissipates at a rate slow enough to permit the operator to perform the required safety test.

Thus, the desired high voltage output appears at the test probe 50 in a rapid manner without any hunting and the desired high voltage level is held for a period sufficiently long for the operator to conduct the required safety test.

If, for some reason, the charge on capacitor 207 dissipates to a level which forces the variable gain amplifier 30 to operate below the required level, the high voltage output signal seen at the test probe 50 will be momentarily below that required for a valid test. The comparator circuit 201 will now be energized thereby connecting the capacitor 207 with the energy source V+ to increase the charge on the capacitor 207 and also increases the voltage signal appearing at the points 208 and 210. The voltage signal appearing on input lead 72 is increased, thus controlling the variable gain amplifier 30 to adjust its output to the power amplifier 40 upward as explained above.

The switch 63, normally closed, connects capacitor 207 to ground to permit a rapid dissipation of the charge stored therein. When the test set operator activates the switches 61 and 62 to begin the test cycle, switch 63 is also operated to open thereby disconnecting the capacitor 207 from ground. At the end of the test cycle, the test set operator, or a timer circuit, operates to open the switches 61 and 62 and to close the switch 63. The open switches 61 and 62 disconnect the variable gain amplifier 30 from the power amplifier 40 and the V ref from the comparator circuit 201 respectively, thereby disabling the test circuit. The closed switch 63 rapidly discharges the capacitor 207 to ground, thereby preparing capacitor 207 for a new test cycle. The operation of these switches also insures against accidental injury to the test set operator from shock hazards.

What is claimed is:

1. A method for controlling the output voltage of a variable voltage generating circuit comprising the steps of:
   determining whether the output voltage falls within a predetermined range of voltages, and
   charging a capacitor, interconnected with an input of the variable voltage generating circuit, when the output voltage falls within the predetermined range of voltages, so as to control the output voltage in response to the charge on the capacitor.

2. The method as set forth in claim 1 wherein the determining step comprises comparing the output voltage with a reference voltage to determine whether the output voltage is less than the reference voltage.

3. A circuit for controlling the output voltage of a variable voltage generating circuit comprising:
   a capacitor connected to an input of the variable voltage generating circuit and
   means responsive to the output voltage for selectively charging the capacitor when the output voltage falls within a predetermined range of voltages, wherein said charge on said capacitor controls said output voltage.

4. A circuit as recited in claim 3 wherein the means comprises
   means for comparing the output voltage with a reference voltage and for generating a signal only when the output voltage is less than the reference voltage, and
   means responsive to said signal for charging the capacitor.

5. A circuit as recited in claim 4 wherein the comparing means further comprises
   means for generating another signal when the output voltage is equal to the reference voltage and the responsive means is further responsive to another signal for preventing the capacitor from being charged.

6. A method for controlling the output voltage of a variable gain amplifier comprising the steps of
   comparing the output voltage of the amplifier with a reference voltage to determine whether the output voltage is less than the reference voltage, and
   charging a capacitor, interconnected with an input of the variable gain amplifier for controlling its output voltage, when the output voltage is less than the reference voltage.

7. A method for controlling the output voltage of a variable gain amplifier as recited in claim 6 comprising the additional steps of
   comparing the output voltage of the amplifier with a reference voltage to determine whether the output voltage is equal to the reference voltage, and
   preventing the charging of the capacitor when the output voltage is equal to the reference voltage.

8. A circuit for supplying a control signal representative of an output signal of a variable voltage generating circuit comprising
   means for comparing the output signal with a reference signal, the comparator means generating a first type of signal when an amplitude parameter of the output signal is less than an amplitude parameter of the reference signal and for generating a second type of signal when the amplitude parameter of the output signal is equal to the amplitude parameter of the reference signal,
   a capacitor capable of being connected to a source of energy,
   means responsive to said first type of signal for connecting the capacitor to the source of energy for as long as the output signal is less than the reference signal and responsive to the second type of signal for disconnecting the capacitor from the source of energy when the output signal equals the reference signal, and means for connecting the energized capacitor to an input of the variable voltage generating circuit for supplying a control signal.

9. A circuit for controlling the output voltage of a variable gain amplifier comprising:
   means for comparing the output voltage of the amplifier with a reference voltage, the comparator means generating a first type of signal when the output voltage is less than the reference voltage and for generating a second type of signal when the output voltage is equal to the reference voltage,
   a capacitor,
   means for connecting the capacitor with a source of energy,
   means responsive to the first type of signal for connecting the capacitor with the source of energy connecting means for as long as the output voltage is less than the reference voltage and responsive to the second type of signal for disconnecting the capacitor from the source of energy connecting means for as long as the reference voltage equals the output voltage, and
   circuit means for connecting the capacitor to the control input of the variable gain amplifier.

10. The circuit as recited in claim 9 wherein said means for connecting said capacitor to the input of said variable gain amplifier comprises
    high impedance circuitry for preventing the rapid discharge of said capacitor.

11. The circuit as recited in claim 9 wherein said circuit further comprises a discharge circuit selectively connected to the capacitor for rapidly discharging said capacitor.

12. The circuit as recited in claim 9 wherein the means for connecting the capacitor to the input of the variable gain amplifier further comprises means for applying a bias voltage to the connecting means.

13. The circuit as recited in claim 9 wherein the comparing means also generates the second type of signal when said output voltage is greater than said reference voltage.

* * * * *